(12) United States Patent
Kim

(10) Patent No.: US 7,651,900 B2
(45) Date of Patent: Jan. 26, 2010

(54) MASK FOR MAKING POLYSILICON STRUCTURE, METHOD OF MAKING THE SAME, AND METHOD OF MAKING THIN FILM TRANSISTOR USING THE SAME

(75) Inventor: Dong-byum Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 617 days.

(21) Appl. No.: 11/194,002

(22) Filed: Jul. 28, 2005

(65) Prior Publication Data

US 2006/0024592 A1    Feb. 2, 2006

(30) Foreign Application Priority Data

Jul. 28, 2004    (KR) .................. 10-2004-0059308

(51) Int. Cl.
*H01L 21/00* (2006.01)

(52) U.S. Cl. .................. 438/166; 430/5; 117/4

(58) Field of Classification Search .......... 430/5; 438/166, 487, 795; 117/4, 8, 108, 904
See application file for complete search history.

(56) References Cited

U.S. PATENT DOCUMENTS

| 6,048,652 | A  | * | 4/2000 | Nguyen et al. | 430/5 |
| 6,756,158 | B2 | * | 6/2004 | Yan | 430/5 |
| 7,056,629 | B2 | * | 6/2006 | Crowder | 430/5 |
| 2002/0192571 | A1 | * | 12/2002 | Schwarzl | 430/5 |
| 2004/0076894 | A1 | * | 4/2004 | Hwang | 430/5 |
| 2004/0106241 | A1 | * | 6/2004 | Kim et al. | 438/166 |

FOREIGN PATENT DOCUMENTS

| JP | 2004-111972 | 4/2004 |
| KR | 2004-011380 | 2/2004 |
| KR | 2004-031315 | 4/2004 |

* cited by examiner

*Primary Examiner*—Mark F Huff
*Assistant Examiner*—Stewart A Fraser
(74) *Attorney, Agent, or Firm*—Innovation Counsel LLP

(57) ABSTRACT

A mask for making a polysilicon structure includes a transmitting area that transmits light and a blocking area that has a metal layer and a semiconductor layer deposited in an alternating manner at least once. The blocking area blocks light. The mask is subject to less thermal stress from the light (e.g., a laser beam) and therefore has a longer life span compared to a conventional mask.

8 Claims, 16 Drawing Sheets

MASK FOR MAKING POLYSILICON STRUCTURE, METHOD OF MAKING THE SAME, AND METHOD OF MAKING THIN FILM TRANSISTOR USING THE SAME

CROSS-REFERENCE TO RELATED APPLICATIONS

This application claims priority to Korean Patent Application No. 2004-0059308, filed on Jul. 28, 2004 in the Korean Intellectual Property Office, the content of which is incorporated herein by reference.

BACKGROUND OF THE INVENTION

1. Field of the Invention

The present invention relates generally to a mask for making polysilicon, a method of making the same and a method of making thin film transistor using the same, and more particularly to a mask for crystallizing amorphous silicon into polysilicon, a method of making the same and a method of making thin film transistor using the same.

2. Description of the Related Art

A liquid crystal display (LCD) includes a couple of substrates having electrodes and a liquid crystal layer sandwiched between the substrates. The substrates are attached to each other by a sealant that is usually printed along the edges of the substrates. When attached to each other, the substrates enclose the liquid crystal layer.

An electric field is applied to the liquid crystal layer through the electrodes. The liquid crystal layer has an anisotropic dielectric constant, and images can be displayed by adjusting the transmittance of light through the liquid crystal layer by changing the electric field. A thin film transistor (TFT) is used to control the signals to the electrodes.

Generally, amorphous silicon is used as a channel area of the TFT. The mobility of amorphous silicon is about 0.5~1 $cm^3/Vsec$. While this mobility range is acceptable for use in a switching device of the LCD, it is not acceptable in a drive circuit formed directly on a liquid crystal panel.

To overcome this problem with amorphous silicon, a polysilicon TFT having a channel area that is formed with a polysilicon has been developed. Polysilicon has a mobility of about 20~150 $cm^3/Vsec$, and this higher mobility of the polysilicon TFT enables the drive circuit to be formed directly on the liquid crystal panel, resulting in the so-called chip-in-glass configuration.

As methods of making a thin film of polysilicon, there are methods of depositing polysilicon directly on the substrate at high temperature, crystallizing a deposited amorphous silicon at high temperature of about 600° C., and crystallizing a deposited amorphous silicon by heat treatment using laser. However as each of these methods involve a high temperature process, use of a glass substrate is difficult. Further, polysilicon formed by these methods has an uneven grain boundary, resulting in inconsistent electrical property of the TFT.

Accordingly, sequential lateral solidification (SLS) method, which can adjust the distribution of the grain boundary, has been developed to solve the above problem. The SLS method uses the fact that when laser is irradiated to a part of amorphous silicon, thereby partly melting the amorphous silicon, the grain of the polysilicon grows from the boundary between a solid area that is not irradiated by the laser and a liquid area that is irradiated by the laser. The growth direction of the grain is generally perpendicular to the boundary.

In the SLS method, the laser beam is irradiated through a transmitting area of a mask, forming a liquid area of molten amorphous silicon layer that approximately matches the shape of the transmitting area. The transmitting area of the mask may include a slit. The grains of the polysilicon grow as described above and the growth of the grains is complete when the grains growing from opposite boundaries meet each other at or near the center of the liquid area. The adjacent amorphous silicon layer is crystallized by moving the mask in the direction of grain growth intermittently, wherein the size of the grain corresponds to the width of the slit.

The mask used in the SLS method conventionally comprises a quartz substrate and a chrome pattern formed thereon. The mask has a blocking area where the irradiation of the laser to the amorphous silicon is blocked and a transmitting area where the laser is irradiated to the amorphous silicon. The chrome pattern is formed at the blocking area.

As chrome has high heat absorption rate and the laser used in the SLS method has considerable energy, the chrome pattern of the mask is easily overheated. Further, as laser is irradiated intermittently, the chrome pattern undergoes a repeated cycle of heating and cooling. This heating and cooling cycle applies thermal stress on the chrome pattern. This thermal stress is increased by the difference in heat expansion coefficient between the chrome and the quartz. After tens of millions of laser shots, the chrome pattern becomes deformed, necessitating mask replacement. This need for periodic mask replacement undesirably increases the production cost.

A mask that does not suffer from the above problems, and therefore having a longer life span, is desired.

SUMMARY OF THE INVENTION

Accordingly, it is an aspect of the present invention to provide a mask for making a polysilicon structure that is subject to less thermal stress from light than the conventional mask. Due to the decreased thermal stress, the mask of the invention has a longer life span than the conventional mask.

It is another aspect of the present invention to provide a method of making the mask and a method of making thin film transistor using the mask.

Additional aspects and advantages of the invention will be set forth in part in the description which follows and, in part, will be obvious from the description, or may be learned by practice of the invention.

The foregoing and/or other aspects of the present invention can be achieved by providing a mask for making a polysilicon structure that includes a transmitting area that transmits light and a blocking area that blocks light. The blocking area has a metal layer and a semiconductor layer deposited in an alternating manner at least once.

The metal layer may be a molybdenum layer.

The semiconductor layer may be a silicon layer.

The transmitting area includes a row of slits or multiple rows of slits. The rows may be parallel to each other, and the slits in neighboring rows may be arranged in a staggered manner.

The uppermost layer in the blocking area may be the semiconductor layer.

Another aspect of the invention can be achieved by providing a method of making a mask for making a polysilicon structure. The method may entail: forming a laser blocking area on a mask substrate by depositing a metal layer and a semiconductor layer on the mask substrate in an alternating manner at least once, and forming a transmitting area that transmits light by subjecting the laser blocking area to photolithography.

Another aspect of the invention can be achieved by providing a method of making a thin film transistor substrate. The method entails: forming an amorphous silicon layer on an insulating substrate; forming a polysilicon layer by crystallizing the amorphous silicon layer with a mask, wherein the mask comprises a transmitting area transmitting light and a blocking area blocking the light. The blocking area has a metal layer and a semiconductor layer deposited in an alternating manner at least once. The crystallization is performed by sequential lateral solidification method. A gate insulating layer is formed on the polysilicon layer, a gate electrode is formed on the gate insulating layer over the polysilicon layer, and an inter layer dielectric having contact holes to expose a part of the polysilicon layer is formed on the gate electrode. A source electrode and a drain electrode are connected to the part of the polysilicon, respectively, through the contact hole.

BRIEF DESCRIPTION OF THE DRAWINGS

These and other aspects and advantages of the present invention will become apparent and more readily appreciated from the following description of the embodiments, taken in conjunction with the accompanying drawings of which.

DETAILED DESCRIPTION OF THE EMBODIMENT

Figure 1:
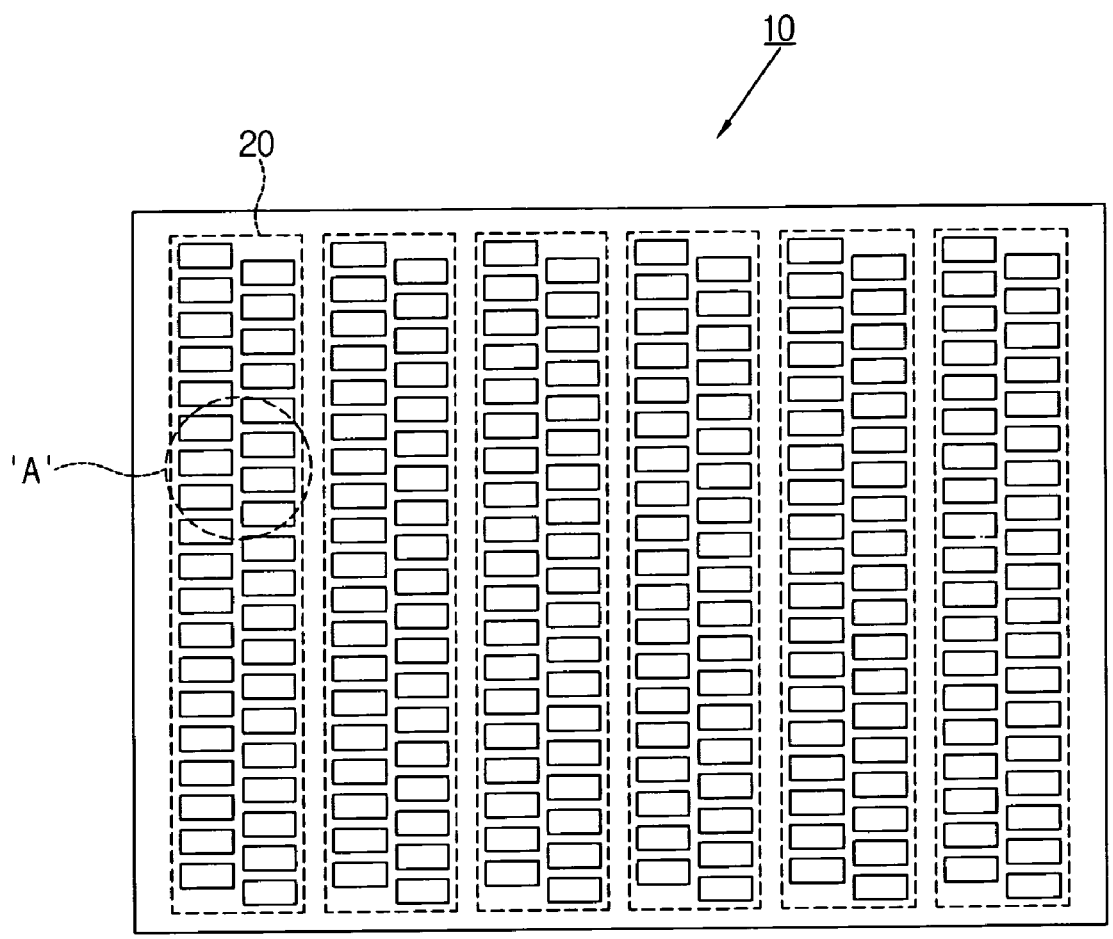
FIG. 1 is a plan view showing the structure of a mask for making polysilicon according to an embodiment of the present invention.

Reference will now be made in detail to the embodiments of the present invention, examples of which are illustrated in the accompanying drawings, wherein like reference numerals refer to like elements throughout. The embodiments are described below in order to explain the present invention by referring to the figures.

First, a mask for making polysilicon will be explained with FIG. 1 through FIG. 3.

Figure 2:
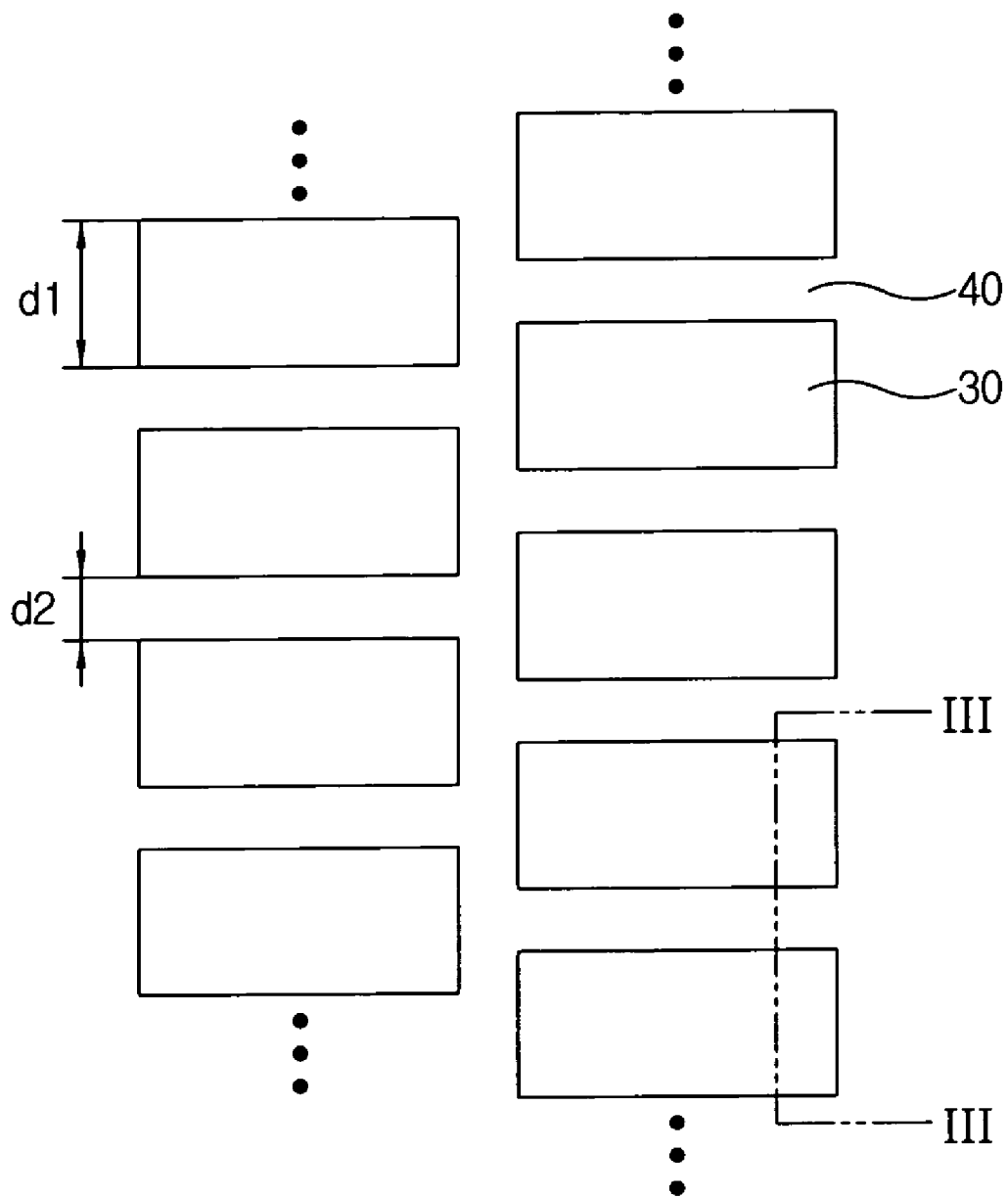
FIG. 2 is an enlarged plan view of the portion labled 'A' in FIG. 1.
Figure 3:
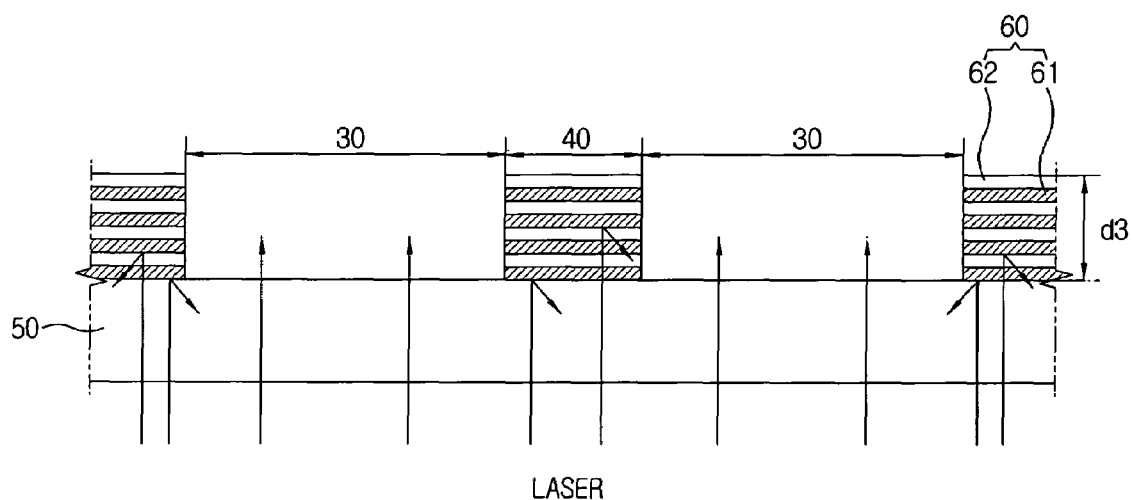
FIG. 3 is a cross-sectional view of the mask for making polysilicon, taken along the line □-□ of FIG. 2.

FIG. 1 is a plan view showing the structure of a mask for making a polysilicon structure according to an embodiment of the present invention, FIG. 2 is an enlarged plan view of the portion indicated with 'A' in FIG. 1 and FIG. 3 is a cross-sectional view of the mask for making the polysilicon structure, taken along the line III-III of FIG. 2.

A mask 10 for making the polysilicon structure (referred as a "mask" hereafter) is roughly rectangular in shape and has a plurality of patterned parts 20. Each patterned part 20 has the same structure as the others and only one patterned part 20 is used in the SLS method. Each patterned part 20 includes a transmitting area 30 and a blocking area 40, wherein the blocking area 40 encloses the transmitting area 30. The transmitting area 30 includes slits that are disposed in two rows that are parallel to each other. The transmitting area 30 in each row is spaced apart from its neighbor by a constant interval and the width d1 of the transmitting area 30 is larger than the distance d2 between the neighboring transmitting areas 30. The transmitting areas 30 in one row are arranged so that they are staggered with respect to the transmitting areas 30 of the neighboring row.

The laser beam irradiated from the upper part of the mask 10 passes through the transmitting area 30, melting the underlying amorphous silicon layer. However, the laser beam does not pass through the blocking area 40 due to a laser blocking layer 60 formed in the blocking area 40.

As shown in FIG. 3, the laser blocking layer 60 is formed on a mask substrate 50. The mask substrate 50 may be formed with quartz. Also, the laser blocking layer 60 forms the blocking area 40.

The laser blocking layer 60 is a multi-layered structure in which a metal layer 61 and a semiconductor layer 62 are deposited in an alternating manner. The metal layer 61 reflects light while the semiconductor layer 62 absorbs light. Further, the metal layer 61 has a high heat conductivity while the semiconductor layer 62 has high heat absorption rate. The alternating arrangement of the metal layer 61 and the semiconductor layer 62 in the laser blocking layer 60 prevents the mask 10 from being heated to high temperature by reflecting or absorbing the heat applied to the mask 10.

The metal layer 61 is preferably formed with a metal having high reflection efficiency, such as molybdenum or aluminum. The semiconductor layer 62 is preferably formed with a silicon layer or a germanium layer.

The thickness of the metal layer 61 is preferably about 2 nm and the thickness of the semiconductor layer 62 is preferably about 7 nm. Each layer 61, 62 is preferably deposited by tens or hundreds times respectively. The uppermost layer of the laser blocking layer 60 is preferably the semiconductor layer 62 to prevent the oxidation of the underlying metal layer 61.

The laser beam irradiating the laser blocking area 61 is reflected at the metal layer 61 or is absorbed by the semiconductor layer 62. The reflection of light at the metal layer 61 and the dispersion of heat by the interaction between the metal layer 61 and the semiconductor layer 62 prevent the laser blocking layer 60 from being heated to a high temperature.

The number of deposited layers, the thickness of each layer and the overall thickness d3 of the laser blocking layer 60 can be adjusted by varying the composition of the metal layer 61 and the semiconductor layer 62, among other factors. Also, the number of the patterned part 20 can be reduced due to the increased life span of the patterned part 20.

A method of making the mask 10 will be explained.

FIG. 4A through FIG. 4E are cross-sectional views showing a method of making the mask 10 according to the embodiment of the present invention.

Figure 4A:
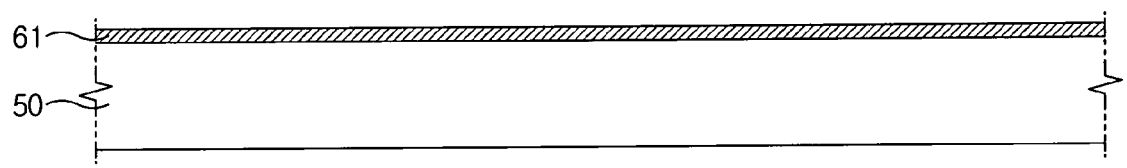
FIG. 4A through FIG. 4E are cross-sectional views showing a method of making the mask for making polysilicon according to the embodiment of the present invention.
Figure 4B:
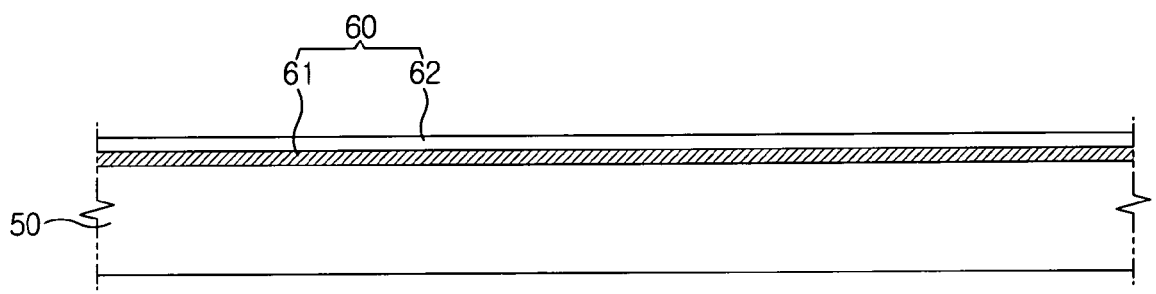
Figure 4C:
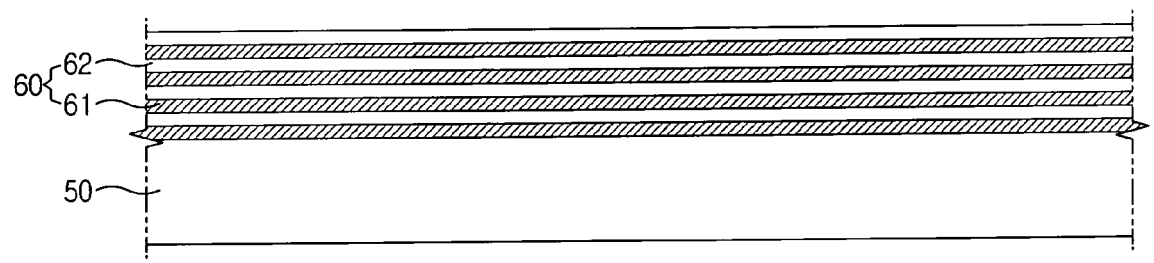

First, as shown in FIG. 4A, the metal layer 61 is deposited on the mask substrate 50 using a conventional method such as sputtering or vacuum evaporation. Then, the semiconductor layer 62 is deposited on the metal layer 61 as shown in FIG. 4B using chemical vapor deposition(CVD) or sputtering. The laser blocking layer 60 is formed by depositing the metal layer 61 and the semiconductor layer 62 in an alternating manner as shown in FIG. 4C.

The transmitting area 30 and the blocking area 40 are formed by performing photolithographic steps on the laser blocking layer 60, the details thereof will be explained.

Figure 4D:
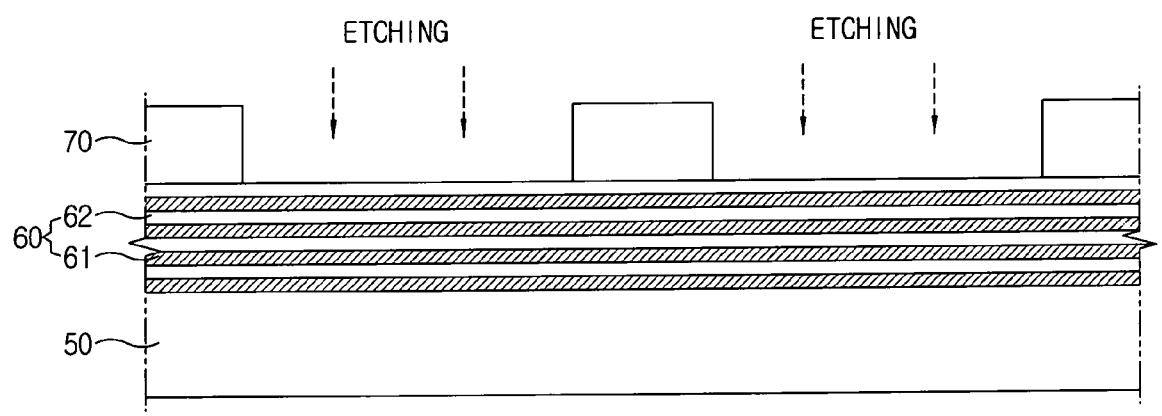
Figure 4E:
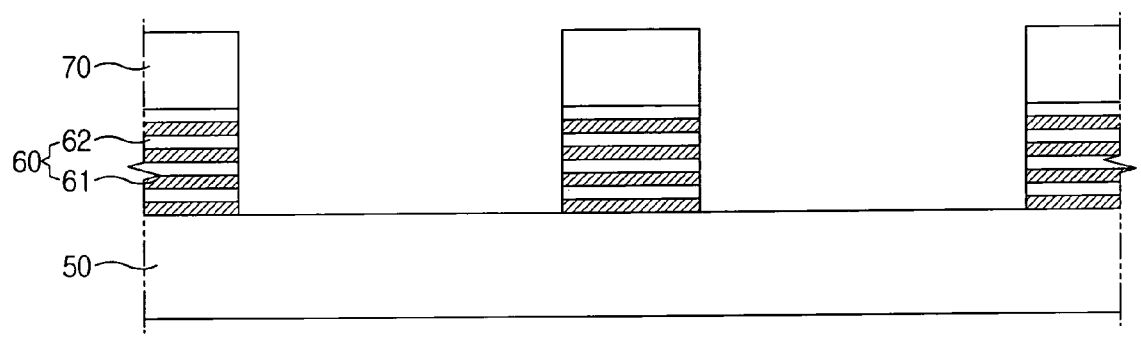

FIG. 4D shows the etching process of the laser blocking layer 60 having a patterned photoresist 70 thereon, wherein the etching may be wet-etching or dry-etching. The photoresist 70 is formed by a sequential process including coating a photosensitive resin on the laser blocking layer 60, exposing the photosensitive resin to light, developing, and baking. FIG. 4E shows the transmitting area 30 and the blocking area 40 after the etching is completed. The mask 10 is completed by removing the photoresist 70 disposed on the laser blocking layer 60.

Polysilicon TFT made by the mask 10 according to the embodiment of the present invention will be explained.

Figure 5:
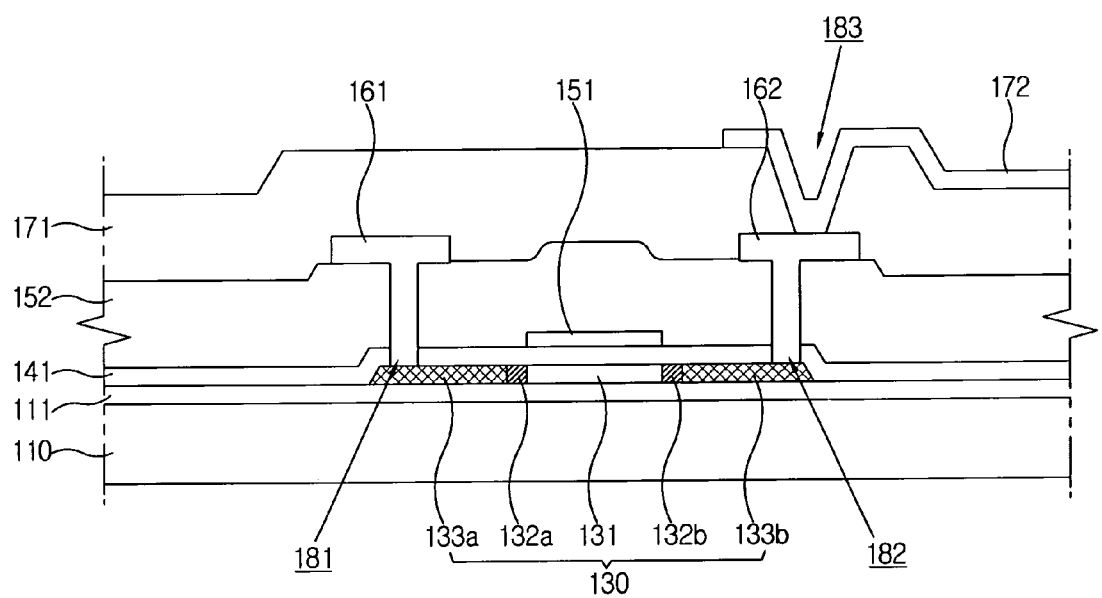
FIG. 5 is a cross-sectional view showing the structure of polysilicon TFT according to the embodiment of the present invention.

FIG. 5 is a cross-sectional view showing the structure of polysilicon TFT according to the embodiment of the present invention.

As shown in FIG. 5, a buffer layer 111 is formed on an insulating substrate 110 and a polysilicon layer 130 is formed on the buffer layer 111. The buffer layer 111 is generally made with silicon oxide and prevents the alkali metal of the insulating substrate 110 from diffusing into the polysilicon layer 130. The polysilicon layer 130 comprises a channel area 131, an LDD (lightly doped domain) areas 132a and 132b, and an ohmic contact areas 133a and 133b, wherein the LDD areas 132a and 132b and the ohmic contact area 133a and 133b are each separated into two parts by the channel area 131. The LDD areas 132a and 132b are n− doped and disperse the hot carrier, while the channel area 131 is not doped by an impurity and the ohmic contact ares 133a and 133b are n+ doped. A gate insulating layer 141 formed with silicon oxide or silicon nitride is disposed on the polysilicon layer 130. A gate electrode 151 is formed on a gate insulating layer 141 over the channel area 131. An inter layer dielectrics 152 covering the gate electrode 151 is formed on the gate insulating layer 141. Contact holes 181 and 182 exposing the ohmic contact area 133a and 133b, respectively, are formed through the gate insulating layer 141 and the inter layer dielectrics 152. A source electrode 161 and a drain electrode 162 connected to the ohmic contact areas 133a and 133b through the contact hole 181 and 182, respectively, are formed on the inter layer dielectrics 152, wherein the source electrode 161 and the drain electrode 162 are positioned on opposing sides of the gate electrode 151. The inter layer dielectrics 152 is covered by a protecting layer 171, where a contact hole 183 exposing a drain electrode 162 is formed through the protecting layer 171. A pixel electrode 172 formed with indium tin oxide, indium zinc oxide or reflective conductive material is formed on the protecting layer 171, wherein the pixel electrode 172 is connected to the drain electrode 162 through the contact hole 183.

A method of making the polysilicon TFT will now be explained.

Figure 6A:
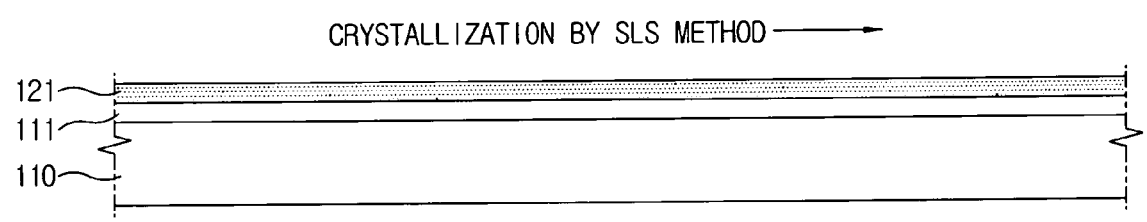
FIG. 6A through FIG. 6E are cross-sectional views showing a method of making the polysilicon TFT according to the embodiment of the present invention.
Figure 6B:
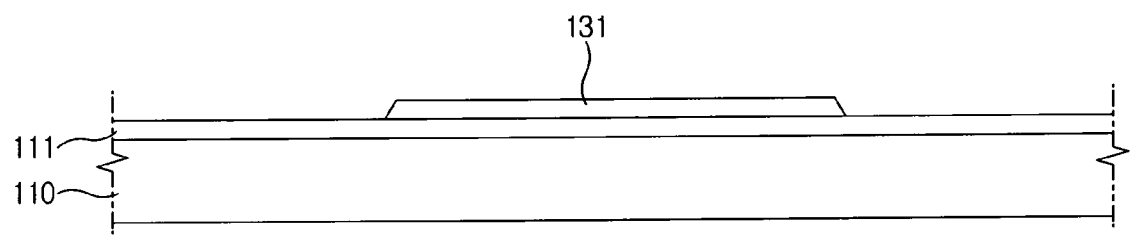
Figure 6C:
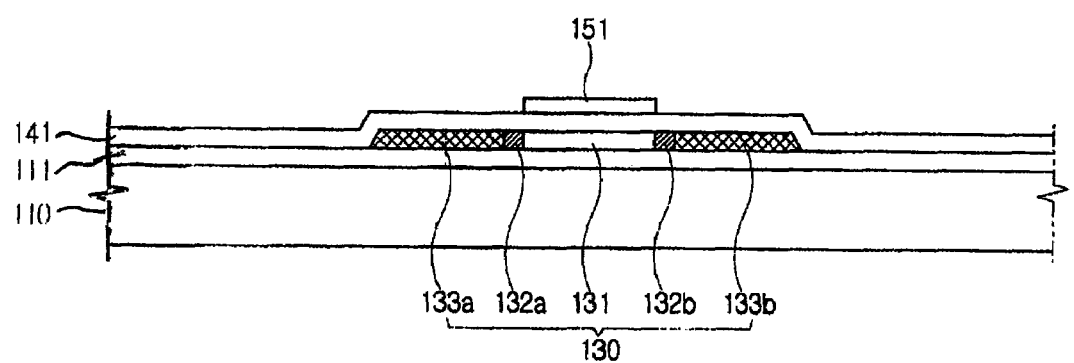
Figure 6D:
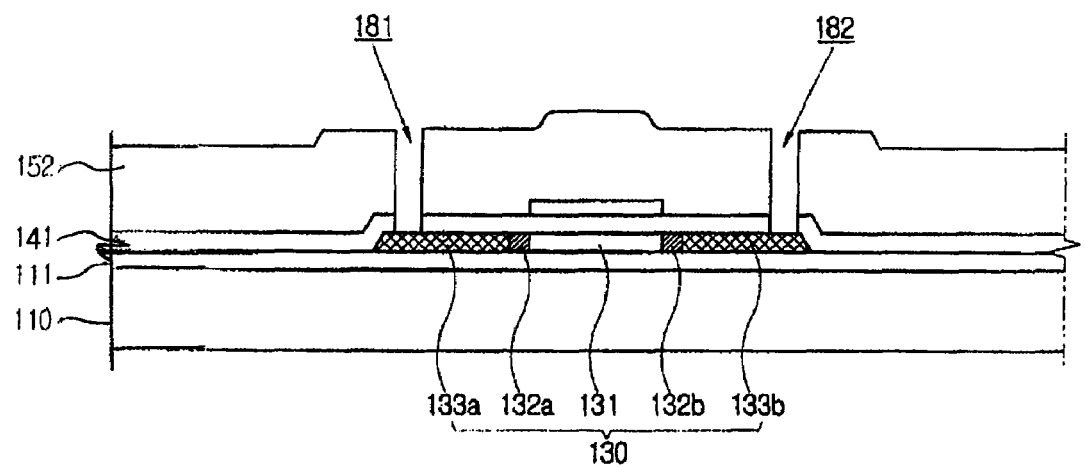
Figure 6E:
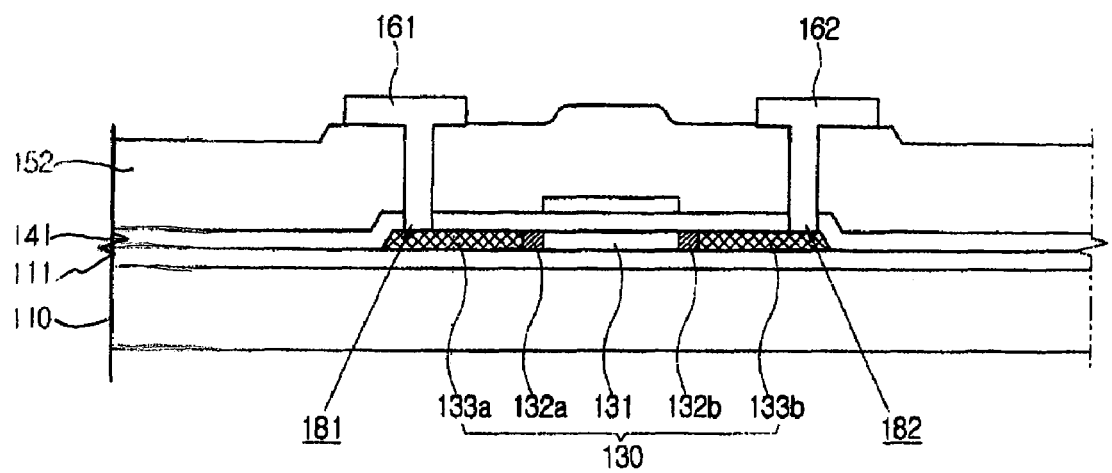
Figure 7:
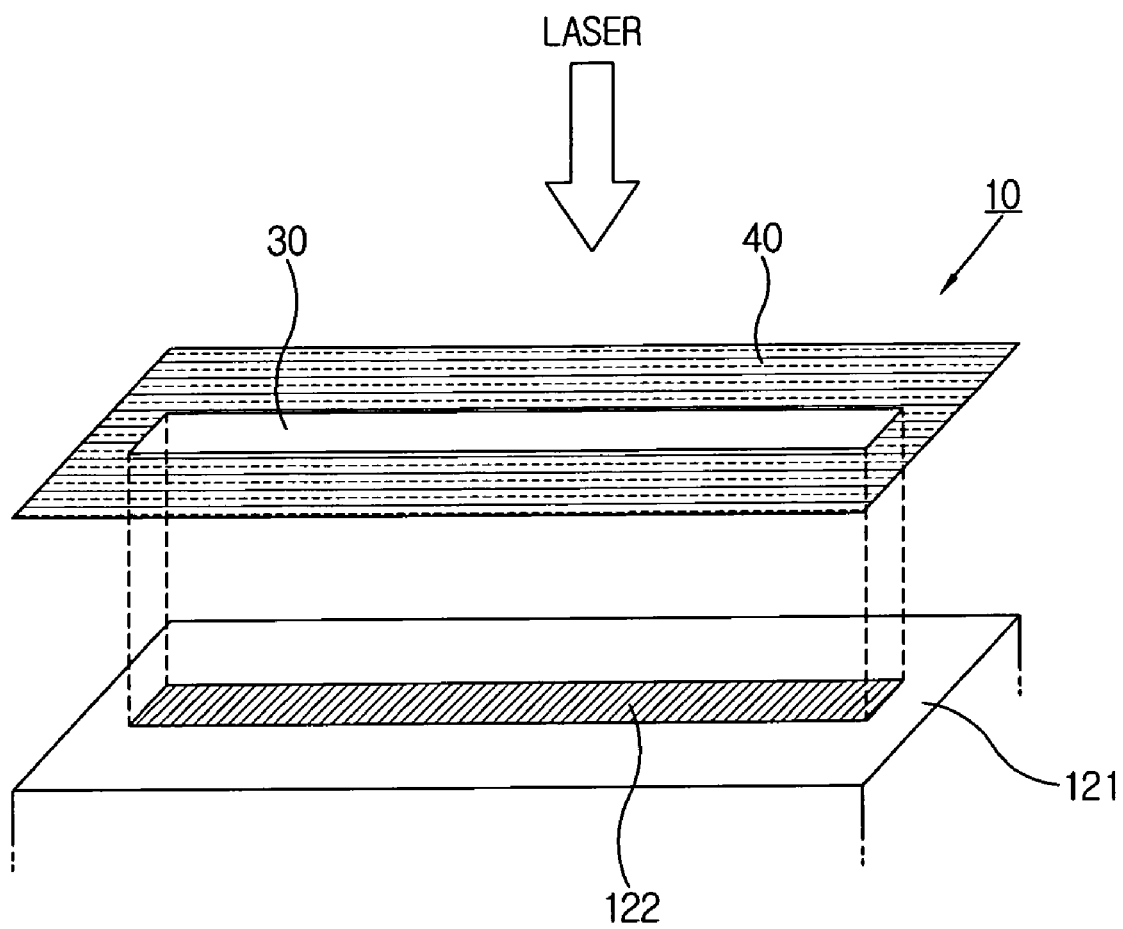
FIG. 7 is a perspective view showing the SLS method in which an amorphous silicon layer is crystallized into a polysilicon layer.
Figure 8:
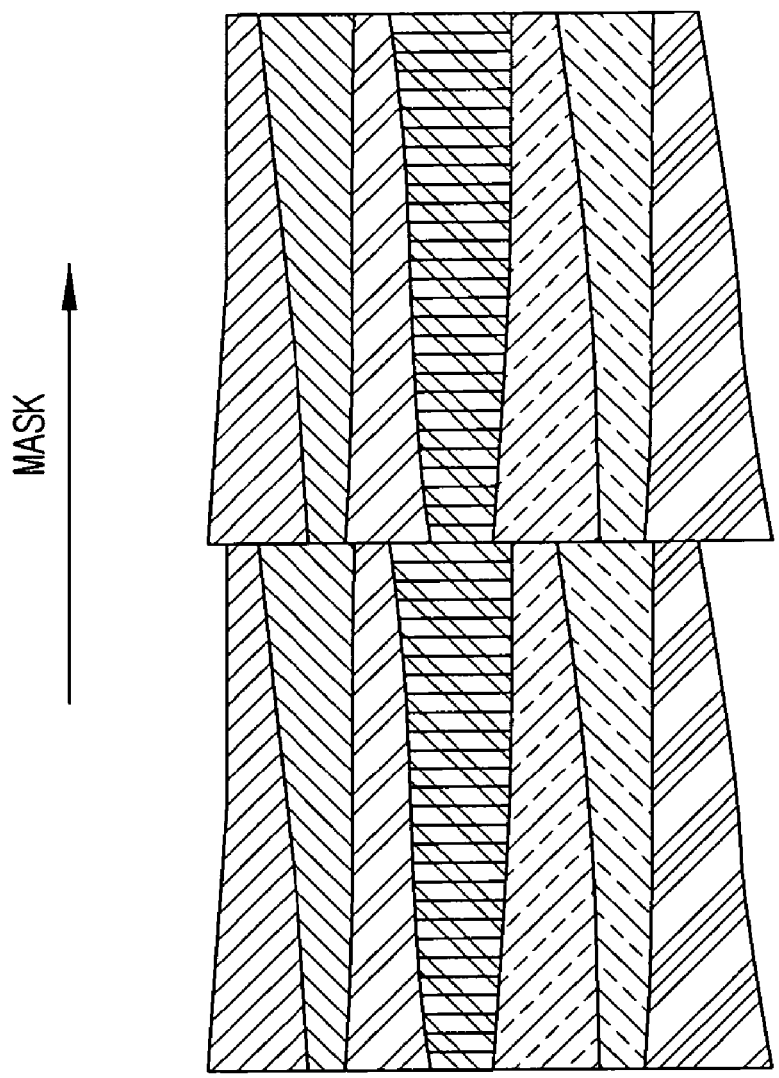
FIG. 8 is a plan view showing the microstructure of the polysilicon while the amorphous silicon layer is crystallized into the polysilicon layer by the SLS method.

FIG. 6A through FIG. 6E are cross-sectional views showing a method of making the polysilicon TFT according to the embodiment of the present invention, FIG. 7 is a perspective view showing the SLS process in which an amorphous silicon layer is crystallized into a polysilicon layer and FIG. 8 is a plan view showing the micro-structure of the polysilicon during the amorphous silicon layer is crystallized into the polysilicon layer through the SLS process.

First, as shown in FIG. 6A, the buffer layer 111 and an amorphous silicon layer 121 are sequentially deposited on the insulating substrate 110. Then, the amorphous silicon layer 121 is crystallized by the SLS method. The mask 10 according to the embodiment of the present invention is used in the SLS method. The crystallizing process is as follows.

As shown in FIG. 7, in the SLS method, the laser beam that is transmitted through the mask 10 having the slit in the transmitting area 30 completely melts the amorphous silicon layer 121 locally, forming a liquid area 122 corresponding to the transmitting area 30.

The grain of the polysilicon grows from the boundary between the solid area and the liquid area 122, while the growth direction of the grain is perpendicular to the boundary. Grain growth is complete when the grains from the opposite boundaries meet each other near the center of the liquid area 122. The growth of the grain may be continued by moving the slit pattern of the mask 10 in the direction of grain growth intermittently while irradiating with the laser.

FIG. 8 shows the microstructure of the grain in the polysilicon layer 130 when the slit pattern is disposed horizontally wherein the grain grows perpendicular to the slit.

FIG. 6B shows the patterned polysilicon layer 131.

The gate insulating layer 141 is formed by depositing a layer of silicon oxide or silicon nitride, as shown in FIG. 6C. Then, a conductive material for gate wiring is deposited and patterned, forming the gate electrode 151. The channel area 131, the LDD area 132a and 132b and the ohmic contact area 133a and 133b are formed by injecting n-type impurity into the polysilicon layer 130 using the gate electrode 151 as a mask. A plurality of methods are provided to make the LDD area 132a and 132b. For example, making an overhang through wet-etching of double-layered gate electrode 151 can be used.

Then, as shown in FIG. 6D, the inter layer dielectrics 152 covering the gate electrode 151 is formed on the gate insulating layer 141. The inter layer dielectric 152 is patterned together with the gate insulating layer 141 to form the contact holes 181 and 182, exposing the ohmic contact areas 133a and 133b, respectively.

Then, as shown in FIG. 6E, a conductive material for data wiring is deposited and patterned, thereby forming the source electrode 161 and the drain electrode 162 connected to the ohmic contact areas 133a and 133b through the contact holes 181 and 182, respectively.

Then, as shown in FIG. 5, the protecting layer 171 is coated on the source electrode 161 and the drain electrode 162 and is patterned to form the contact hole 183 exposing the drain electrode 162. The pixel electrode 172 is formed by depositing and patterning of indium tin oxide, zinc tin oxide or reflective conductive material.

As described above, the present invention provides a mask for making a polysilicon structure having an improved life span due to the heat-dispersing property of the laser blocking layer. Also, the present invention provides a method of making the mask and a method of making TFT using the mask.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of making a thin film transistor substrate comprising:
    forming an amorphous silicon layer on an insulating substrate;
    forming a polysilicon layer by irradiating the amorphous silicon layer with a laser beam through a mask for crystallization, wherein the mask comprises a transmitting area transmitting light and a blocking area that has a metal layer and a semiconductor layer deposited in an alternating manner at least once starting with the metal layer and blocking the light, wherein the mask is disposed such that the laser beam reaches the metal layer before the semiconductor layer, and wherein the crystallization is performed by sequential lateral solidification method;

forming a gate insulating layer on the polysilicon layer;

forming a gate electrode on the gate insulating layer over the polysilicon layer;

forming an inter layer dielectric having contact holes to expose a part of the polysilicon layer on the gate electrode; and forming a source electrode and a drain electrode connected to the part of the polysilicon, respectively, through the contact hole.

2. The method according to claim 1, wherein the transmitting area comprises a row of slits.

3. The method according to claim 2, wherein the transmitting area comprises multiple rows of slits.

4. The method according to claim 3, wherein the rows of slits are parallel to each other.

5. The method according to claim 4, wherein the slits in neighboring rows are arranged in a staggered manner.

6. The method according to claim 1, wherein the metal layer is a molybdenum layer.

7. The method according to claim 1, wherein the semiconductor layer is a silicon layer.

8. The method according to claim 1, wherein the semiconductor layer in the blocking area is at least twice as thick as the metal layer.

* * * * *